(12) United States Patent
Shionoya et al.

(10) Patent No.: US 11,064,625 B2
(45) Date of Patent: Jul. 13, 2021

(54) INTERFACE CIRCUIT, SUBSTRATE, ELECTRONIC DEVICE, AND PROGRAMMABLE CONTROLLER

(71) Applicant: Mitsubishi Electric Corporation, Tokyo (JP)

(72) Inventors: Hiroki Shionoya, Tokyo (JP); Sosuke Funakoshi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/042,918

(22) PCT Filed: Apr. 26, 2018

(86) PCT No.: PCT/JP2018/017059
§ 371 (c)(1),
(2) Date: Sep. 29, 2020

(87) PCT Pub. No.: WO2019/207731
PCT Pub. Date: Oct. 31, 2019

(65) Prior Publication Data
US 2021/0022262 A1 Jan. 21, 2021

(51) Int. Cl.
*H05K 7/14* (2006.01)
*G05B 19/05* (2006.01)
(Continued)

(52) U.S. Cl.
CPC .......... *H05K 7/1481* (2013.01); *G05B 19/05* (2013.01); *H05K 1/115* (2013.01); *H05K 7/1484* (2013.01);
(Continued)

(58) Field of Classification Search
CPC ....... G05B 19/05; H05K 1/18; H05K 2201/09
(Continued)

(56) References Cited

U.S. PATENT DOCUMENTS 9,233,617 B2  1/2016  Ichikawa
2013/0109317 A1*  5/2013  Kikuchi ................. H01P 1/208
455/41.2

(Continued)

FOREIGN PATENT DOCUMENTS

JP    2001-154712 A    6/2001
JP    2005-071077 A    3/2005
(Continued)

OTHER PUBLICATIONS

International Search Report and Written Opinion dated Jul. 24, 2018 for PCT/JP2018/017059 filed on Apr. 26, 2018, 6 pages including English Translation of the International Search Report.
(Continued)

*Primary Examiner* — Md Azad
(74) *Attorney, Agent, or Firm* — Xsensus LLP

(57) ABSTRACT

An interface circuit includes: a connector connectable to a PC; a communication circuit capable of generating a transmission signal to another electronic device; a first region that is set between the connector and the communication circuit to allow an electrical isolation device to be mounted therein; wiring lines used to connect the communication circuit and the connector to each other through the first region; and wiring lines used to connect the electronic circuit and the connector to each other through a region other than the first region.

17 Claims, 11 Drawing Sheets

(51) Int. Cl.
  *H05K 1/11* (2006.01)
  *H05K 1/18* (2006.01)
(52) U.S. Cl.
  CPC ...... *G05B 2219/14075* (2013.01); *H05K 1/18* (2013.01); *H05K 2201/09227* (2013.01); *H05K 2201/09954* (2013.01); *H05K 2201/10022* (2013.01); *H05K 2201/10053* (2013.01); *H05K 2201/10189* (2013.01)
(58) Field of Classification Search
  USPC .......................................................... 327/108
  See application file for complete search history.

(56) References Cited

U.S. PATENT DOCUMENTS

| | | | | |
|---|---|---|---|---|
| 2014/0002023 A1* | 1/2014 | Ichikawa | ............... | B60L 53/22 320/109 |
| 2015/0048804 A1* | 2/2015 | Toivanen | ............... | G06F 1/266 320/162 |
| 2017/0357803 A1* | 12/2017 | Amarilio | ............. | G06F 11/3055 |
| 2018/0048045 A1* | 2/2018 | Kikuchi | ................. | H01P 5/082 |
| 2019/0067801 A1* | 2/2019 | Kang | .................... | H01Q 1/243 |

FOREIGN PATENT DOCUMENTS

| | | |
|---|---|---|
| JP | 2008-034259 A | 2/2008 |
| JP | 2012-008763 A | 1/2012 |
| JP | 2016-046516 A | 4/2016 |
| WO | 2012/127673 A1 | 9/2012 |

OTHER PUBLICATIONS

Decision to Grant a Patent received for Japanese Patent Application No. 2018-554797, dated Jan. 8, 2019, 5 pages including English Translation.

* cited by examiner

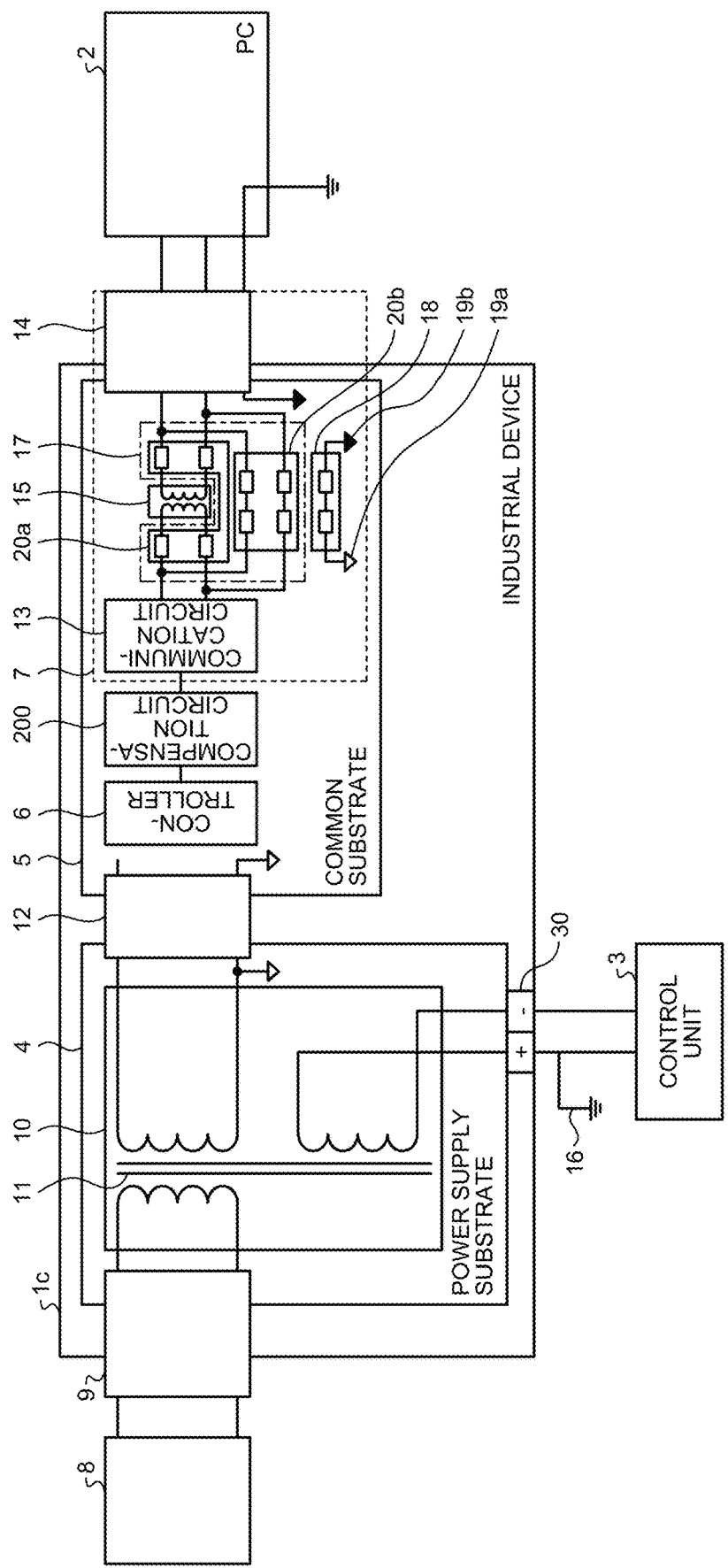

INTERFACE CIRCUIT, SUBSTRATE, ELECTRONIC DEVICE, AND PROGRAMMABLE CONTROLLER

CROSS-REFERENCE TO RELATED APPLICATION

The present application is based on PCT filing PCT/JP2018/017059, filed Apr. 26, 2018, the entire contents of which are incorporated herein by reference.

FIELD

The present invention relates to an interface circuit equipped in an electronic device and connectable to another device, a substrate on which such an interface circuit mounted, an electronic device, and a programmable controller.

BACKGROUND

An electronic device, such as an industrial device may have a power supply circuit and an interface circuit for allowing connection to another device such as a personal computer. If a positive terminal of the power supply circuit is grounded to the frame ground and the electronic device is connected to another device sharing the frame ground, via the interface circuit, a short-circuit fault may be caused on the other device. For this reason, an electrical isolation device is placed on the path including the power supply circuit and the other device thereby to prevent a short-circuit fault on the other device.

A power supply circuit provided in an electronic device, such as an industrial device, is categorized as an isolated power supply circuit having an isolation function or a non-isolated power supply circuit that does not have any isolation function. In a case where the electronic device connectable to the other device, described above uses an isolated power supply circuit as a power supply circuit thereof, no isolation device separated from the power supply circuit is not required to be provided. Thus, in the case of consideration of a possibility to provide an isolation device in an interface circuit, as interface circuit mounted substrates, substrates having their respective wiring patterns different between a case where an isolation device is mounted and another case where no isolation device is mounted have to be prepared.

Patent Literature 1 discloses a technique in which a power conversion facility connectable to an external power supply has an isolation transformer and a switchgear unit, and the switchgear unit is used to switch between a path routed through the isolation transformer and another path not routed through the isolation transformer.

CITATION LIST

Patent Literature

Patent Literature 1: WO 2012/127673 A

SUMMARY

Technical Problem

However, preparing substrates having their respective wiring patterns different between a case where an isolation device is mounted and a case where no isolation device is mounted is not preferable from the viewpoint of increasing production efficiency. The substrates on each of which an interface circuit is mounted desirably has a communalized wiring pattern without relying on the type of the power supply circuit for the electronic device.

In the technique described in Patent Literature 1, the power conversion facility necessarily includes an isolation transformer so as to allow switching between a path routed through the isolation transformer and a path not routed through the isolation transformer. Thus, Patent Literature 1 does not disclose a technique for commonalizing substrates on each of which an isolation transformer is mounted for both cases, one of which is directed to an isolation transformer being provided and another of which is directed to no isolation transformer being provided.

The present invention has been made in view of the above circumstances, and it is an object of the present invention to provide an interface circuit that can eliminate necessity for making a wiring pattern different dependent on the type of the power supply circuit for an electronic device on which the circuit is mounted.

Solution to Problem

In order to solve the above-mentioned problem and achieve the object, the present invention provides an interface circuit mountable on an electronic device and connectable to another electronic device, the interface circuit comprising: a connector connectable to the other electronic device; an electronic circuit capable of generating a transmission signal to the other electronic device; a first region that is defined between the electronic circuit and the connector to allow an isolation device to be mounted therein; a first wiring line to connect the electronic circuit and the connector to each other through the first region; and a second wiring line to connect the electronic circuit and the connector to each other through a region other than the first region.

Advantageous Effects of Invention

An interface circuit according to the present invention yields an advantageous effect in that it can eliminate a necessity for making a wiring pattern different dependent on the type of the power supply circuit for an electronic device on which the circuit is mounted.

BRIEF DESCRIPTION OF DRAWINGS

FIG. 14 is a diagram illustrating an example configuration of an industrial device having a compensation circuit provided between the communication circuit and the controller.

DESCRIPTION OF EMBODIMENT

An interface circuit, a substrate, an electronic device, and a programmable controller according to an embodiment of the present invention will be described in detail below with reference to the drawings. Note that this embodiment is not necessarily intended to limit the scope of this invention.

Embodiment.

Figure 1:
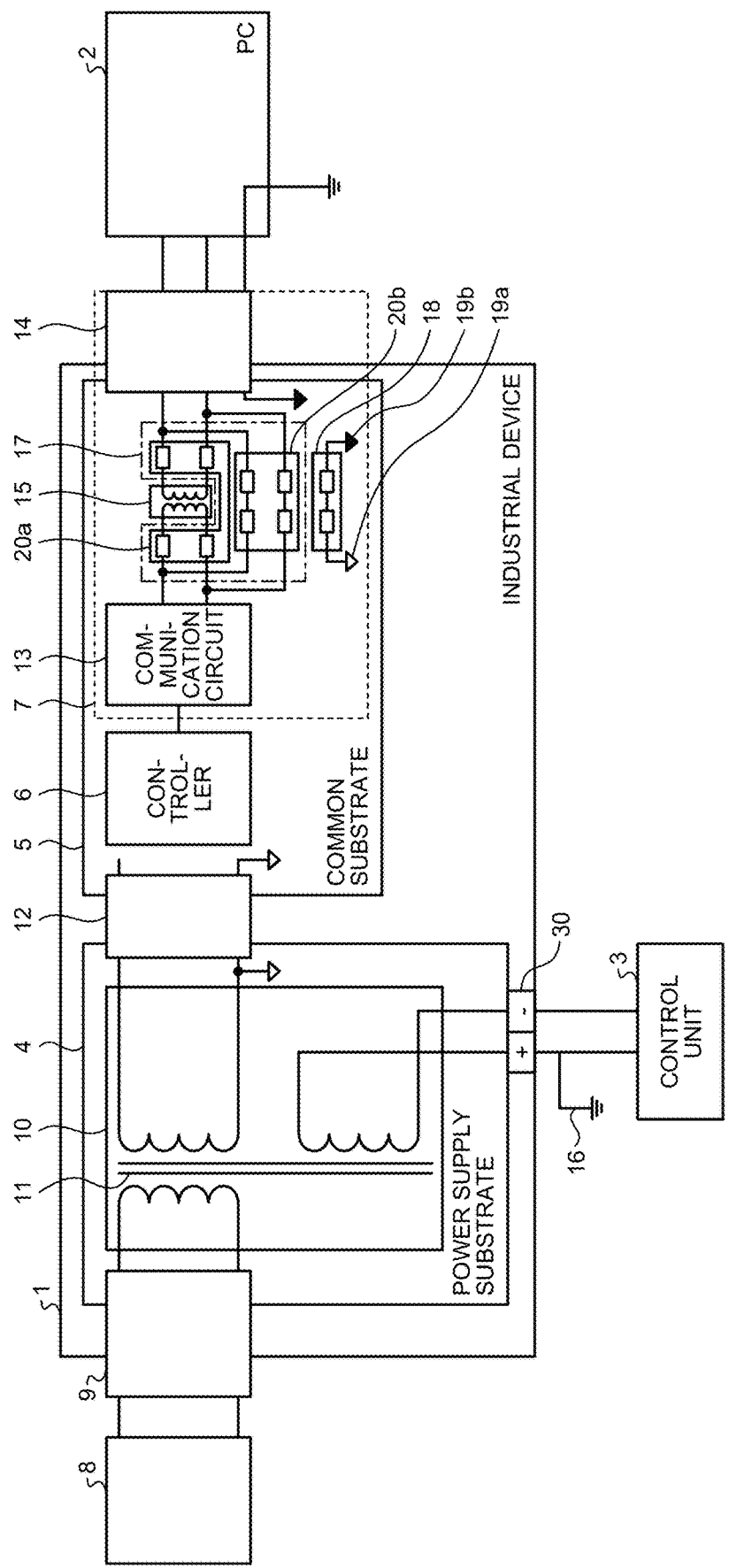
FIG. 1 is a diagram illustrating an example configuration of an industrial device according to an embodiment.

FIG. 1 is a diagram illustrating an example configuration of an industrial device according to an embodiment of the present invention. The present embodiment will be described, by way of example, in terms of an industrial device 1 which is an example of an electronic device. The industrial device 1 is a device for use in a factory or the like. The following description assumes that the industrial device 1 is a unit forming a programmable controller. The electronic device according to the present invention is not limited to this example, but only has to be any electronic device that includes an interface circuit 7 for allowing connection to another electronic device, and have a possibility to be required to perform electrical isolation in the interface circuit. The interface circuit 7 is mountable on an electronic device, and is connectable to another electronic device.

As illustrated in FIG. 1, the industrial device 1 includes a power supply substrate 4, a common substrate 5, and an inter-substrate connector 12. The industrial device 1 is connectable to an external power supply 8. The industrial device 1 is also connectable to a personal computer (hereinafter referred to as PC) 2 that is an example of another electronic device, and is further connectable to a control unit 3. FIG. 1 also illustrates the external power supply 8, the PC 2, and the control unit 3 together with the industrial device 1. FIG. 1 illustrates a situation in which the industrial device 1 is connected to each of the external power supply 8, the control unit 3, and the PC 2. The control unit 3 is a device to be connected to the industrial device 1, an example of which is shown as a sensor. Note that although FIG. 1 illustrates an example of the industrial device 1 being connectable to the control unit 3, the present invention is applicable even to an industrial device having no function of connecting with the control unit 3.

The power supply substrate 4 has a power supply connector 9, a power supply circuit 10, and a connection connector 30 each mounted thereon. The power supply circuit 10 is an isolated power supply circuit including an isolation transformer 11. FIG. 1 illustrates an example of the industrial device 1 having an isolated power supply circuit mounted thereon, but as described later, the industrial device 1 may have a non-isolated power supply circuit mounted thereon, the non-isolated power supply circuit failing to have the isolation transformer 11 in some cases. The power supply circuit 10 is driven by an internal power supply (not illustrated), and steps up or steps down a voltage applied from the external power supply 8 through the power supply connector 9 so as to generate power supply to be used in each of an inside of the industrial device 1 and the control unit 3. The power supply generated by the power supply circuit 10 is supplied to the common substrate 5 through the inter-substrate connector 12, and is supplied to the control unit 3 through the connection connector 30. A wiring line connecting the positive terminal of the connection connector 30 and the control unit 3 is grounded at a ground point 16. The ground point 16 is an earth grounding point.

The common substrate 5 is a substrate on which the interface circuit 7 of the present embodiment is mounted. The common substrate 5 has a controller 6 and the interface circuit 7 mounted thereon. The interface circuit 7 includes a communication circuit 13 and a connector 14. The communication circuit 13 has a communication function of transmitting a signal to and receive a signal from the PC 2. The communication circuit 13 that is an example of an electronic circuit capable of generating a transmission signal to another electronic device can transfer a signal received from the PC 2 to the controller 6, and can transmit a signal received from the controller 6 to the PC 2. The controller 6 is a control circuit configured to control operation of the industrial device 1. The controller 6 can generate a signal to be transmitted to the PC 2, and can process a signal received from the PC 2. The connector 14 can connect the communication circuit 13 and the PC 2 to each other.

The common substrate 5 is provided with grounding portions 19a and 19b. The grounding portion 19a is a ground inside the industrial device 1, which is a ground common to another substrate such as the power supply substrate 4. The grounding portion 19b is a ground inside the industrial device 1, which is a ground connected with the connector 14. The grounding portion 19a and the grounding portion 19b are electrically isolated from each other. The common substrate 5 can further have an isolation device 15, a wiring line connection unit 17, and a ground connection unit 18 each mounted thereon. In the present embodiment, wirings for portions associated with the isolation device 15, the wiring line connection unit 17, and the ground connection unit 18 are common regardless of whether the power supply circuit mounted on the industrial device 1 is an isolated power supply circuit or a non-isolated power supply circuit, and a determination is made as to whether to mount a connection part such as a 0-Ω resistor to connect between wiring lines, depending on whether the power supply circuit mounted on the industrial device 1 is an isolated power circuit or a non-isolated power circuit. This enables a same wiring pattern to be realized regardless of whether the power supply circuit mounted on the industrial device 1 is an isolated power supply circuit or a non-isolated power supply circuit in manufacturing of the common substrate 5 as a printed board, and can thus realize communalization of substrates each owning an interface circuit without depending on the configuration of the power supply circuit that supplies an electric current to the device.

In the industrial device 1, if no electrical isolation is provided in the communication circuit 13 or in the power supply circuit, connection of the positive terminal of the connector 30 to the ground point 16 causes the path of the communication signal to be connected to an earth, which may possibly in turn cause a fault due to short-circuit in the personal computer 2 or the like. For this reason, in the present embodiment, the isolation device 15 is mounted on the common substrate 5 in a case where a power supply circuit included in the industrial device 1 is a non-isolated power circuit. In addition, connection of the industrial device 1 to the personal computer 2 may cause some noise from the personal computer 2. In the present embodiment, the grounding portions 19a and 19b are connected to each other to enhance grounding function to improve noise immunity in a case where the isolation device 15 is not included.

Figure 2:
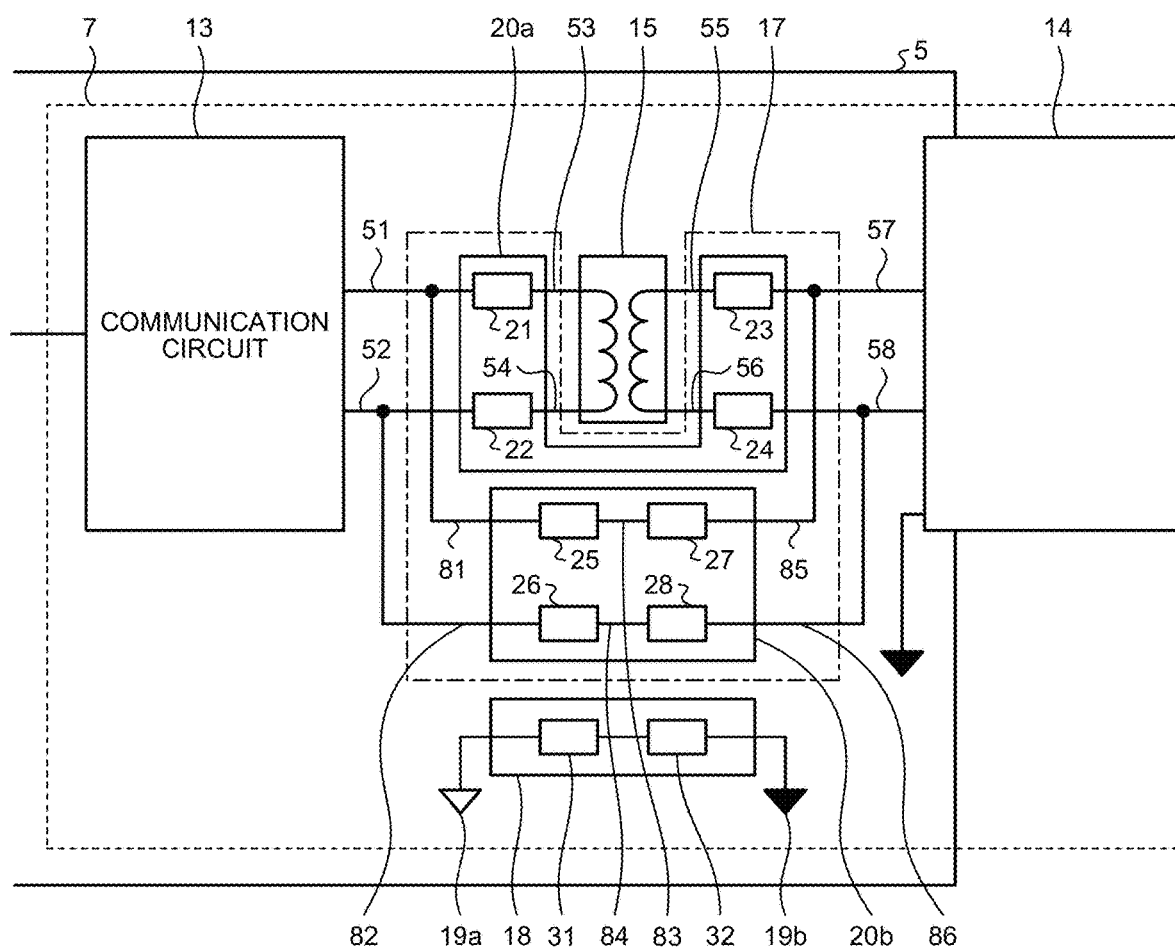
FIG. 2 is an enlarged view of the interface circuit illustrated in FIG. 1.

A configuration of the isolation device 15, the wiring line connection unit 17, and the ground connection unit 18 illustrated in FIG. 1 shows an example in which mountable connection parts are all mounted thereon. Therefore, the configuration illustrated in FIG. 1 is typically not provided in practice. FIG. 2 is an enlarged view of the interface circuit 7 illustrated in FIG. 1. As illustrated in FIGS. 1 and 2, the wiring line connection unit 17 includes a first wiring line connection unit 20a and a second wiring line connection unit 20b.

The first wiring line connection unit 20a includes first connection parts, i.e., connection parts 21 to 24. The connection parts 21 to 24 are each, for example, a 0-Ω resistor. In addition, the first wiring line connection unit 20a may be mounted as a single component including the connection parts 21 to 24, such as a component called jumper switch, or may be mounted as the connection parts 21 to 24 that are separate components.

Description is given using FIG. 2 for a connection relations of the portions in the case where the connection parts 21 to 24 and the isolation device 15 are mounted on the common substrate 5. The connection parts 21 and 22 are connected to wiring lines 51 and 52 that are connected to the communication circuit 13, respectively. Wiring lines 53 and 54 respectively connect the connection parts 21 and 22 with the isolation device 15. By mounting the connection parts 21 and 22 on the common substrate 5, the communication circuit 13 and the isolation device 15 are connected to each other. Wiring lines 55 and 56 respectively connect the isolation device 15 with the connection parts 23 and 24. The connection parts 23 and 24 are connected to the connector 14 through wiring lines 57 and 58, respectively. Thus, the communication circuit 13 and the connector 14 are connected to each other through the wiring lines 51 to 58, which are first wiring lines, the isolation device 15, and the connection parts 21 to 24. It is noted that, of the wiring lines 51 and 52, portions up to their respective branch points to wiring lines 81 and 82 serve as the first wiring lines, and at the same time, serve as second wiring lines.

The second wiring line connection unit 20b includes second connection parts, i.e., connection parts 25 to 28. The connection parts 25 to 28 are each, for example, a 0-Ω resistor. In addition, the second wiring line connection unit 20b may be mounted as a single component including the connection parts 25 to 28, such as a component called jumper switch, or may be mounted as the connection parts 25 to 28 that are separate components.

Description is given using FIG. 2 for connection relations of the parts in the case where the connection parts 25 to 28 are mounted on the common substrate 5. The connection part 25 is connected to the communication circuit 13 through the wiring line 51 connected to the communication circuit 13 and the wiring line 81 connected to the wiring line 51. The connection part 26 is connected to the communication circuit 13 through the wiring line 52 connected to the communication circuit 13 and the wiring line 82 connected to the wiring line 52. The connection part 27 is connected in series to the connection part 25 through a wiring line 83, and is also connected to the connector 14 through a wiring line 85 connected to the wiring line 57 and the wiring line 57. The connection part 28 is connected in series to the connection part 26 through a wiring line 84, and is also connected to the connector 14 through a wiring line 86 connected to the wiring line 58 and the wiring line 58. In this way, the communication circuit 13 is connected to the connector 14 through the wiring lines 81 to 86, which are second wiring lines, and the connection parts 25 to 28. That is, the paths routed through the wiring lines 81 to 86 and the connection parts 25 to 28 allow the communication circuit 13 and the connector 14 to be connected to each other without intervention of the isolation device 15.

The ground connection unit 18 includes third connection parts, i.e., connection parts 31 and 32. The connection parts 31 and 32 are each, for example, a 0-Ω resistor. In addition, the ground connection unit 18 may be mounted as a single component including the connection parts 31 and 32, such as a component called jumper switch, or may be mounted as the connection parts 31 and 32 that are separate components. The connection part 31 is connected to the grounding portion 19a, which is a first grounding portion, through a wiring line provided on the common substrate 5. The connection part 32 is connected to the grounding portion 19b, which is a second grounding portion, through a wiring line provided on the common substrate 5. The grounding portion 19a is connected to the communication circuit 13, and the grounding portion 19b is connected to the connector 14.

Description is given using FIG. 2 for connection relations of the parts in the case where the connection parts 31 and 32 are mounted on the common substrate 5. The connection parts 31 and 32 are connected in series to each other through a wiring line. By mounting the connection parts 31 and 32 on the common substrate 5, the grounding portion 19a and the grounding portion 19b are connected to each other through the connection parts 31 and 32 and the wiring lines. Note that FIG. 2 illustrates a pair of the connection parts 31 and 32, but two or more pairs of the connection parts 31 and 32 may be provided.

Figure 3:
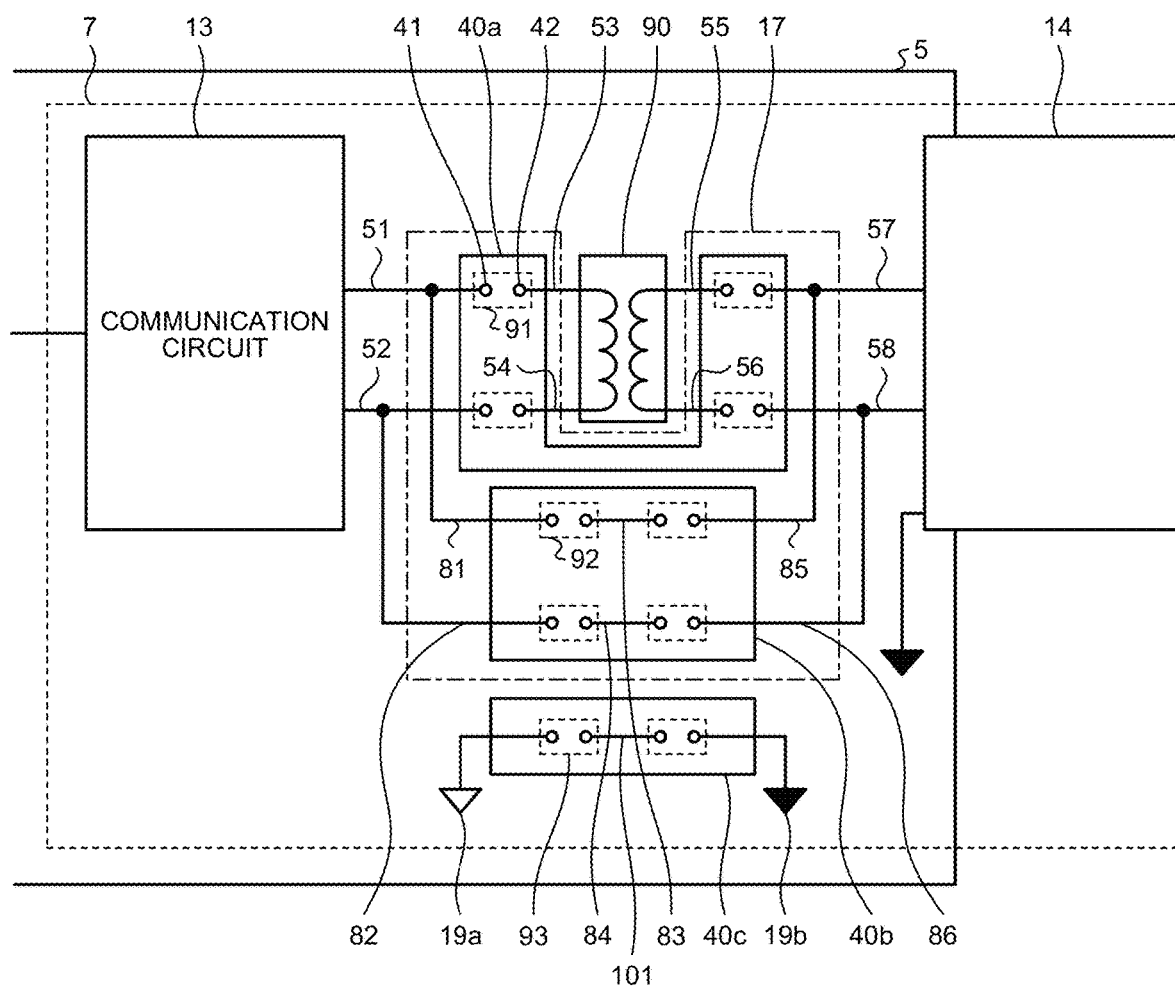
FIG. 3 is a diagram illustrating an example configuration of an interface circuit on which a first wiring connection unit, an isolation device, a second wiring connection unit, and a ground connection unit are not mounted.

FIG. 3 is a diagram illustrating an example configuration of the interface circuit 7 that does not have mounted thereon the first wiring line connection unit 20a, the isolation device 15, the second wiring line connection unit 20b, and the ground connection unit 18. As illustrated in FIG. 3, the interface circuit 7 is provided with regions on which the isolation device 15, the first wiring line connection unit 20a, the second wiring connection unit 20b, and the ground connection unit 18 are to be mounted. That is, the interface circuit 7 has a first region 90 in which the isolation device 15 can be mounted. The first region 90 is placed between the communication circuit 13 and the connector 14. The interface circuit 7 has second regions 91 in which the connection parts 21 to 24 can be mounted, and the first wiring lines. The second regions 91 are placed between the communication circuit 13 and the connector 14. The first wiring lines are wiring lines connecting the communication circuit 13 and the connector 14 to each other through the first region 90, and more specifically, correspond to the wiring lines 51 to 58 for connecting the communication circuit 13 and the connector 14 to each other through the first region 90 and the second regions 91.

The interface circuit 7 also includes third regions 92 placed between the communication circuit 13 and the connector 14, in which the connection parts 25 to 28 can be mounted, and the second wiring lines. The third regions 92 are each an example of region other than the first region. The second wiring lines are the wiring lines 81 to 86 for connecting the communication circuit 13 and the connector 14 to each other through the third regions 92.

The interface circuit 7 further includes fourth regions 93 placed between the grounding portion 19*a* and the grounding portion 19*b*, in which the connection parts 31 and 32 can be mounted, and third wiring lines. The third wiring lines are wiring lines 101 for connecting the grounding portion 19*a* and the grounding portion 19*b* to each other through the fourth regions 93.

Note that, in FIG. 3, one of the second regions 91 respectively corresponding to the connection parts 21 to 24 is denoted by a reference character, one of the third regions 92 respectively corresponding to the connection parts 25 to 28 is denoted by a reference character, and one of the fourth regions 93 respectively corresponding to the connection parts 31 and 32 is denoted by a reference character.

For example, in the second region 91 where the connection part 21 of the first wiring line connection unit 20*a* can be provided, there are an end portion 41, which is an end portion of the wiring line connected to the communication circuit 13, and another end portion 42, which is an end portion of the wiring line connectable to the isolation device 15. In a case where h the connection part 21 is mounted, connection of the end portion 41 and the end portion 42 through the connection part 21 causes the communication circuit 13 and the isolation device 15 to be connected to each other. Also for the connection parts 22 to 28, 31, and 32, similarly to the case of the connection part 21, connection is made between two wiring lines corresponding to a section where each its own connection part is mounted, when each of the connection parts 22 to 28, 31, and 32 is mounted. In the present embodiment, the wiring lines in a situation in which the first wiring line connection unit 20*a*, the second wiring line connection unit 20*b*, and the ground connection unit 18 are not mounted as illustrated in FIG. 3 is common regardless of whether the power supply circuit mounted on the industrial device 1 is an isolated power supply circuit or a non-isolated power supply circuit.

Figure 4:
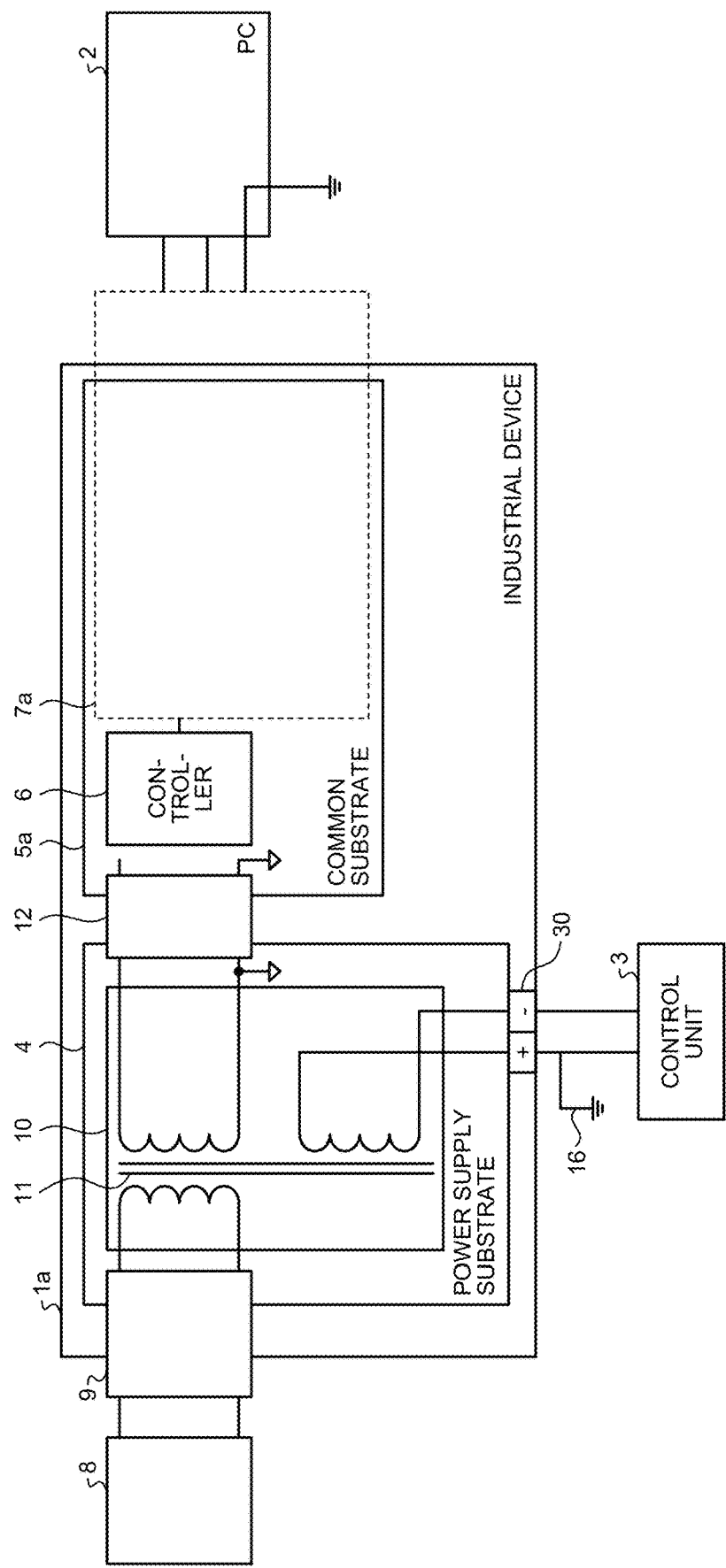
FIG. 4 is a diagram illustrating an example configuration of an industrial device in a case where the power supply circuit mounted on the industrial device is an isolated power supply circuit.

Next, description is given for an example configuration of the interface circuit which is dependent on whether the power supply circuit mounted on the industrial device is an isolated power supply circuit or a non-isolated power supply circuit. FIG. 4 is a diagram illustrating an example configuration of an industrial device in a case where the power supply circuit mounted on the industrial device is an isolated power supply circuit. An industrial device 1*a* illustrated in FIG. 4 includes, similarly to the industrial device 1 illustrated in FIG. 1, the power supply circuit 10 that is an isolated power supply circuit. As illustrated in FIG. 4, the industrial device 1*a* includes a common substrate 5*a* in place of the common substrate 5 of the industrial device 1. The common substrate 5*a* is similar to the common substrate 5 illustrated in FIG. 1 except including an interface circuit 7*a* in place of the interface circuit 7 of the common substrate 5 illustrated in FIG. 1. In FIG. 4, components having functionality similar to the functionality of those in FIG. 1 are designated by the same reference characters as used in FIG. 1, and description of components having functionality similar to the functionality of those in FIG. 1 will be omitted.

Figure 5:
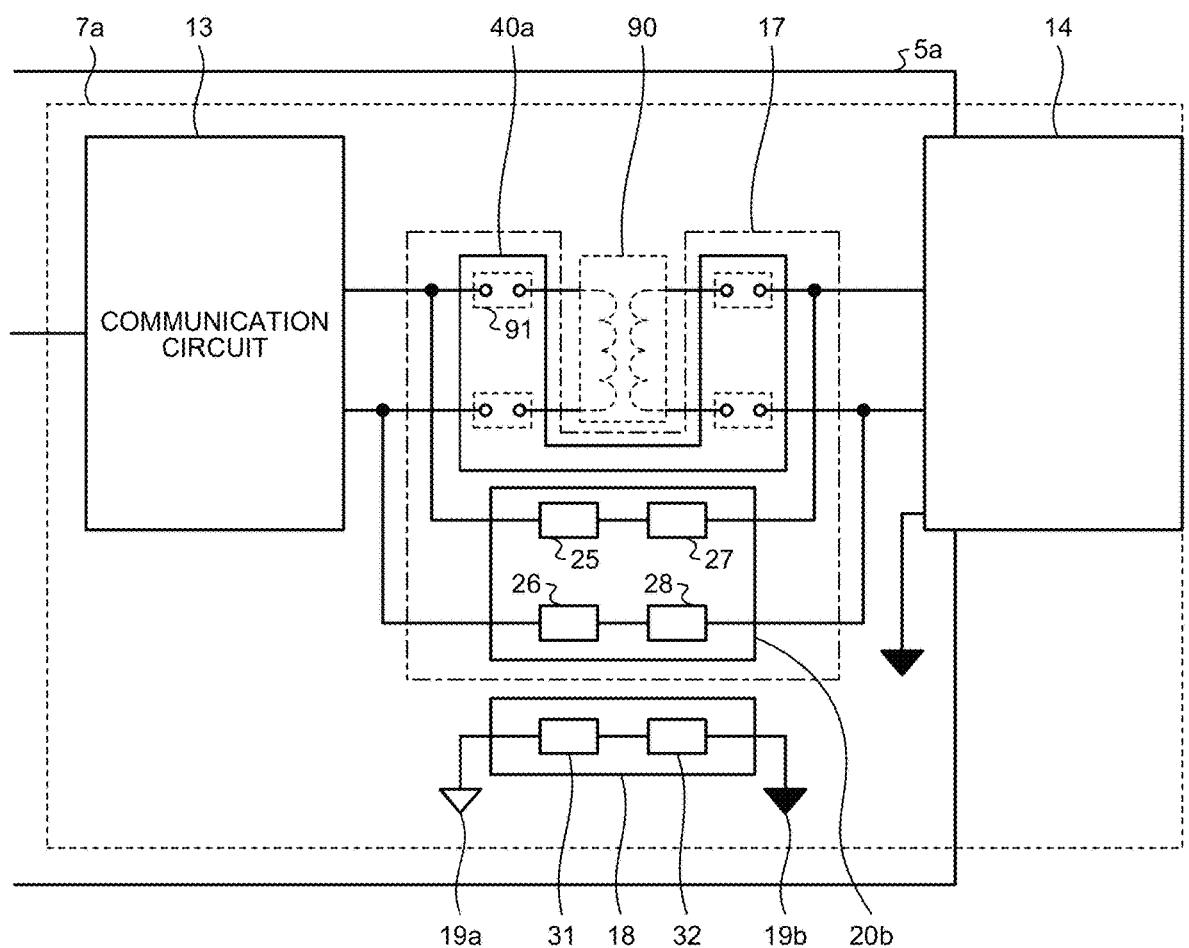
FIG. 5 is an enlarged view of the interface circuit illustrated in FIG. 4.

FIG. 5 is an enlarged view of the interface circuit 7*a* illustrated in FIG. 4. As illustrated in FIG. 5, the interface circuit 7*a* includes the second wiring line connection unit 20*b* and the ground connection unit 18. That is, the example illustrated in FIG. 4 is directed to a configuration such that the second wiring line connection unit 20*b* and the ground connection unit 18 are added to the common substrate 5 illustrated in FIG. 3 on which the first wiring line connection unit 20*a*, the isolation device 15, the second wiring line connection unit 20*b*, and the ground connection unit 18 are not mounted. A region 40*a* is an area in which the first wiring line connection unit 20*a* can be mounted. The interface circuit 7*a* does not have the first wiring line connection unit 20*a* mounted in the region 40*a*, and also not have the isolation device 15 mounted therein. This is because the example configuration illustrated in FIG. 4 is configured such that a ground of the interface circuit 7*a* and the ground point 16 of the control unit 3 are separated from each other by the power supply circuit 10, thereby eliminating the need for the isolation device 15. Since the isolation device 15 is expensive in general, prevention of the isolation device 15 from being mounted when not needed will reduce the cost.

Figure 6:
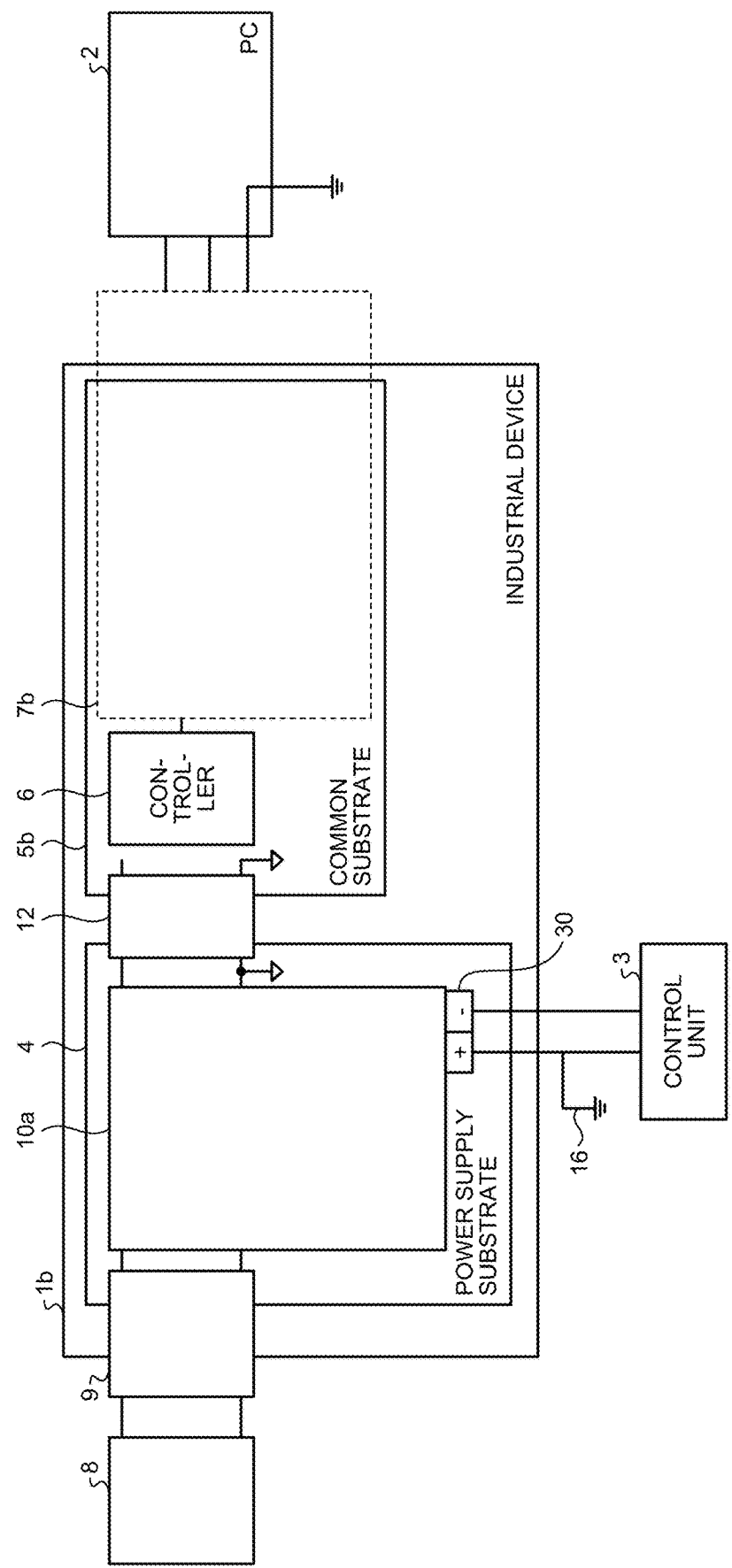
FIG. 6 is a diagram illustrating an example configuration of an industrial device in a case where the power supply circuit mounted on the industrial device is a non-isolated power supply circuit.

FIG. 6 is a diagram illustrating an example configuration of an industrial device in a case where the power supply circuit mounted on the industrial device is a non-isolated power supply circuit. An industrial device 1*b* illustrated in FIG. 6 includes a power supply circuit 10*a* that is a non-isolated power supply circuit having no isolation transformer. As illustrated in FIG. 6, the industrial device 1 includes a common substrate 5*b* in place of the common substrate 5 of the industrial device 1. The common substrate 5*b* is similar to the common substrate 5 illustrated in FIG. 1 except including an interface circuit 7*b* in place of the interface circuit 7 of the common substrate 5 illustrated in FIG. 1. In FIG. 6, components having functions similar to those in FIG. 1 are designated by the same reference characters as those used in FIG. 1, and description of the components having the similar functions to those in FIG. 1 will be omitted.

Figure 7:
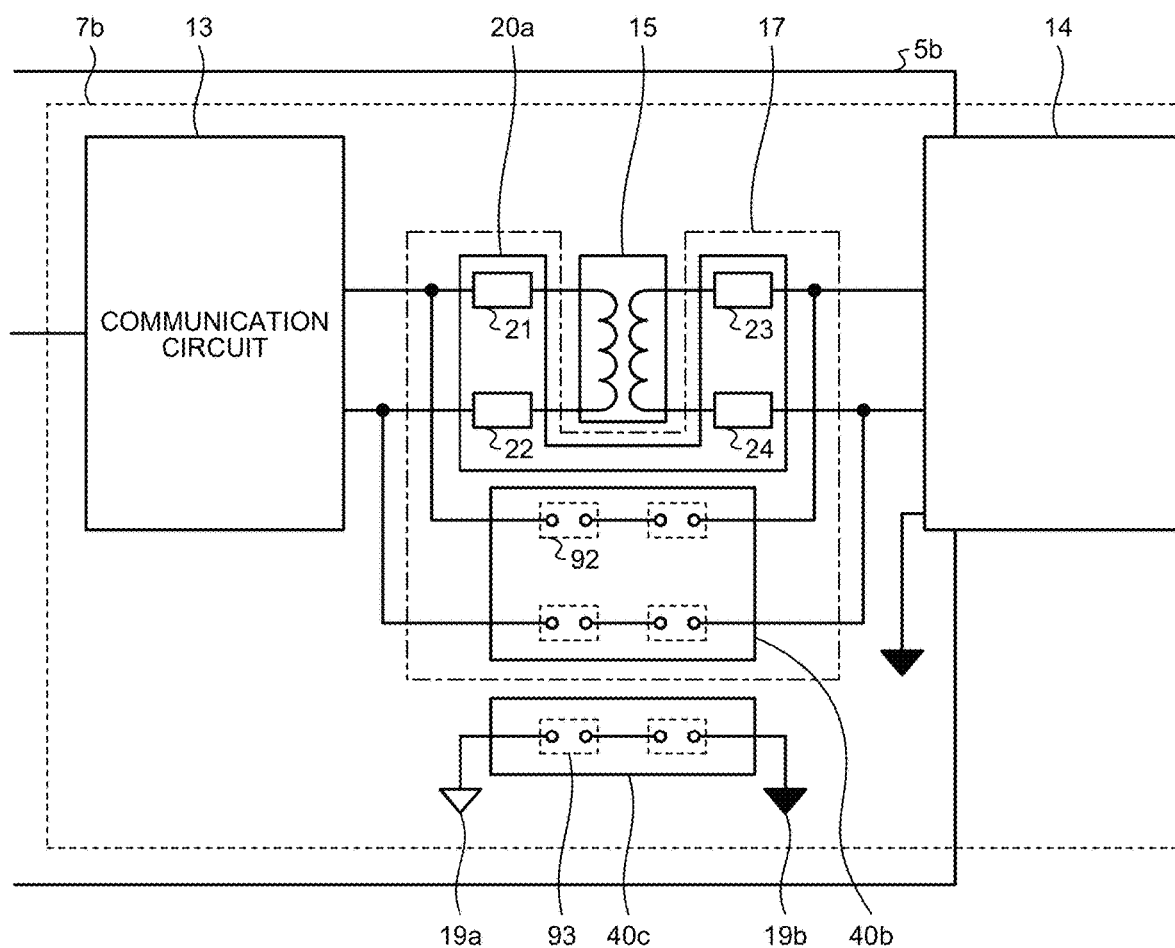
FIG. 7 is an enlarged view of the interface circuit illustrated in FIG. 6.

FIG. 7 is an enlarged view of the interface circuit 7*b* illustrated in FIG. 6. As illustrated in FIG. 7, the interface circuit 7*b* includes the first wiring line connection unit 20*a* and the isolation device 15. That is, the example illustrated in FIG. 7 is directed to a configuration such that the first wiring line connection unit 20*a* and the isolation device 15 are added to the common substrate 5 illustrated in FIG. 3 on which the first wiring line connection unit 20*a*, the isolation device 15, the second wiring connection line unit 20*b*, and the ground connection unit 18 are not mounted. A region 40*b* is an area in which the second wiring line connection unit 20*b* can be mounted. A region 40*c* is an area in which the ground connection unit 18 can be mounted. The interface circuit 7*b* does not have the second wiring line connection unit 20*b* mounted in the region 40*b*, and does not have the ground connection unit 18 mounted in the region 40*c*. This is because the example configuration illustrated in FIG. 6 is configured such that the power supply circuit 10*a* is a non-isolated power supply circuit, thereby requiring the isolation device 15 to be provided in the interface circuit 7*b*.

As described above, in the present embodiment, wiring lines of the interface circuit are communalized for a case where the power supply circuit is an isolated power supply circuit and another case where the power supply circuit is a non-isolated power supply circuit, so as to make a change as to whether or not to mount each of the first wiring line connection unit 20a, the isolation device 15, the second wiring line connection unit 20b, and the ground connection unit 18. By so doing, substrates having wiring patterns already formed thereon can be communalized between a case where the power supply circuit is an isolated power supply circuit and another case where the power supply circuit is a non-isolated power supply circuit, when the interface circuit is mounted on the common substrate 5.

Figure 8:
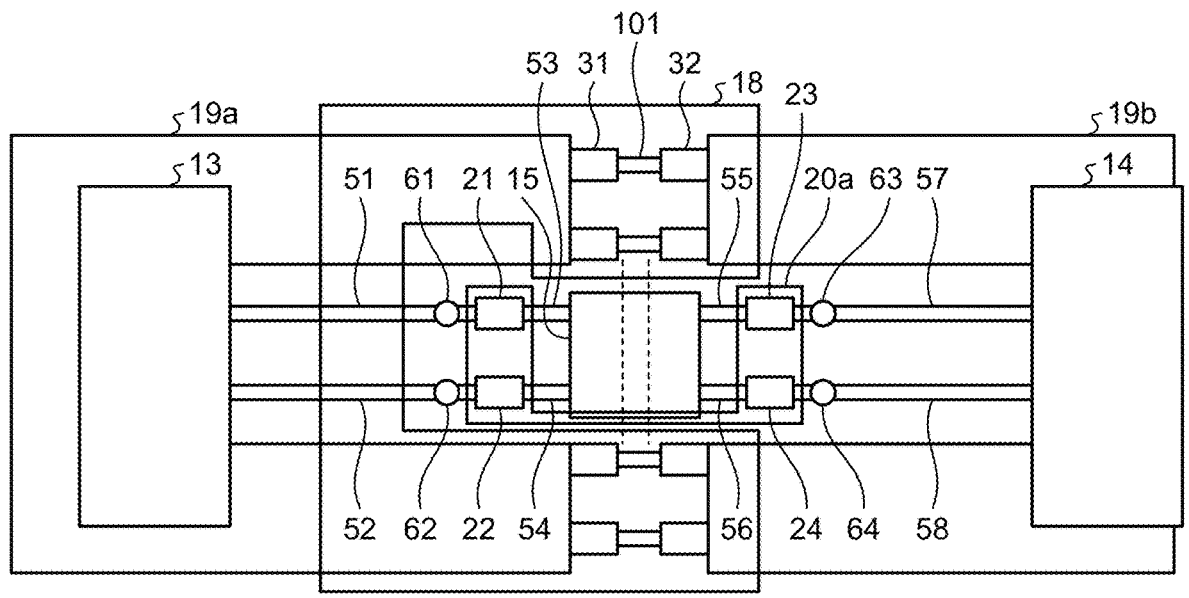
FIG. 8 is a view illustrating a substrate mounting surface of the common substrate having the interface circuit illustrated in FIG. 2 mounted thereon.
Figure 9:
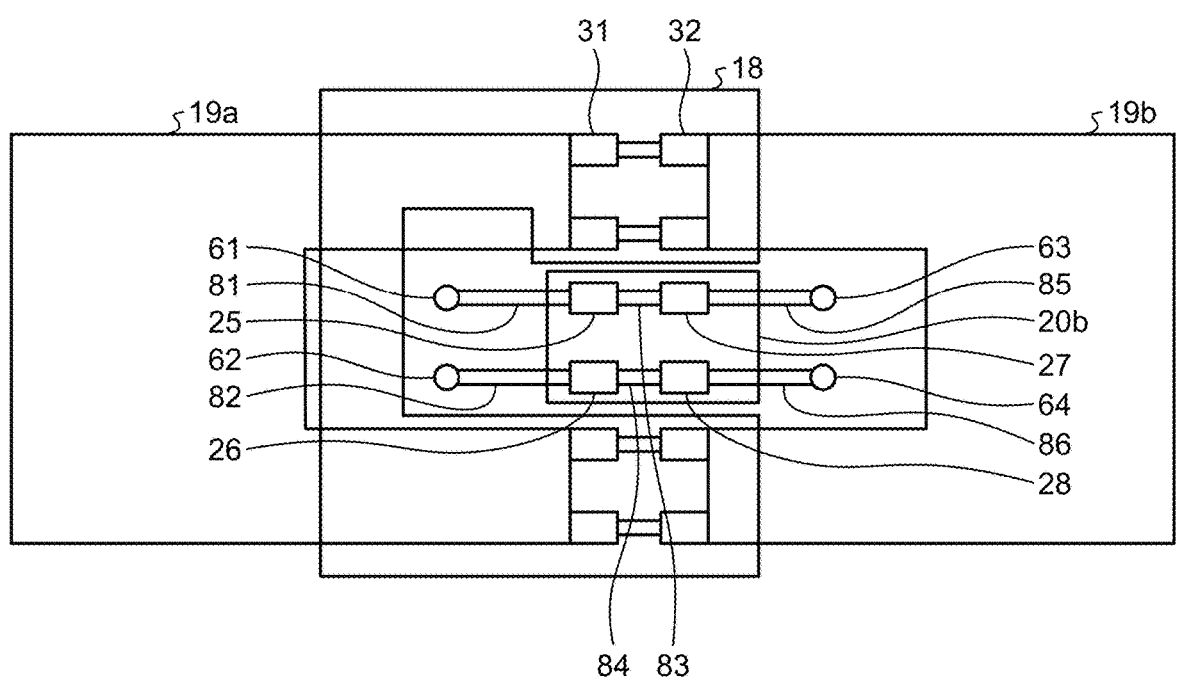
FIG. 9 is a view of the common substrate having the interface circuit illustrated in FIG. 2 mounted thereon, as viewed from the back surface side.

A mounting example of the interface circuit of the present embodiment will next be described. FIG. 8 is a view of the common substrate 5 on which the interface circuit 7 illustrated in FIG. 2 is mounted, as viewed from the substrate mounting surface side. FIG. 9 is a view of the common substrate 5 on which the interface circuit 7 illustrated in FIG. 2 is mounted, as viewed from the back surface side of the substrate 5. The said "substrate mounting surface" refers to a surface of the common substrate 5 on which elements such as the communication circuit 13 and the connector 14 are mounted, which is also referred to as front surface or first surface. The said "back surface" refers to a rear surface when the substrate mounting surface of the common substrate 5 is regarded as a front surface, which is also referred to as second surface.

FIGS. 8 and 9 each correspond to a situation in which the first wiring line connection unit 20a, the isolation device 15, the second wiring line connection unit 20b, and the ground connection unit 18 are all mounted. The first wiring line connection unit 20a and the isolation device 15 are mounted on the first surface, while the second wiring line connection unit 20b is mounted on the second surface. In addition, a ground layer is provided in an inside of the common substrate 5. FIGS. 8 and 9 respectively illustrate the front surface and the back surface of the substrate having a ground layer provided on a surface layer in addition to portions of the wiring lines. In the example illustrated in FIGS. 8 and 9, the grounding portions 19a and 19b are realized by ground layers located apart from each other. In the mounting example illustrated in FIGS. 8 and 9, the wiring lines 51 and 52 connected to the communication circuit 13 are formed as wiring patterns on the first surface. The wiring lines 51 and 52 are connected to the connection parts 21 and 22 of the first wiring line connection unit 20a, respectively. The connection parts 21 and 22 are connected to the isolation device 15 through the wiring lines 53 and 54. The common substrate 5 is provided with vias 61 to 64. The wiring lines 51 and 52 are connected to the wiring lines 81 and 82 through the vias 61 and 62, respectively. The wiring lines 57 and 58 are connected to the wiring lines 85 and 86 through the vias 63 and 64, respectively. The isolation device 15 is connected to each of the connection parts 23 and 24 through the respective different wiring lines. The connection parts 23 and 24 are connected to the connector 14 through the wiring lines 57 and 58, respectively.

The common substrate 5 is formed of a double-sided board, whose surface layer has wiring portions and the ground formed thereon. In addition, in a case in which the common substrate 5 is formed of a four-layer board, the common substrate 5 may also be configured such that a ground layer is provided in one of the inner layers, i.e., the second and third layers, and the ground layer formed by the surface layer and the ground layer formed by that inner layer are connected to each other by a via. Note that the number of layers of the common substrate 5 is not limited to this example.

The wiring lines 81 and 82 respectively connecting the vias 61 and 62 with the connection parts 25 and 26 are provided on the second surface. The wiring lines 83 and 84 respectively connecting the connection parts 25 and 26 with the connection parts 27 and 28 are provided on the second surface. The wiring lines 85 and 86 respectively connecting the connection parts 27 and 28 with the vias 63 and 64 are provided on the second surface.

In addition, as illustrated in FIGS. 8 and 9, the wiring lines for connecting the grounding portion 19a and the grounding portion 19b to each other through the connection parts 31 and 32 are provided on the ground layer of the common substrate 5. FIGS. 8 and 9 illustrate an example in which the connection parts 31 and 32 are each constructed of four parts, but the number of the connection parts 31 and 32 is not limited to this example. In the example illustrated in FIGS. 8 and 9, the grounding portion 19a and the grounding portion 19b are shaped to surround the first region, the second region, and the third region, that is, the isolation device 15 and the connection parts 21 to 28. Note that the phrase "to surround the first region, the second region, and the third region" not only means to surround the entire perimeter of an enveloping area of the first region, the second region, and the third region, but also means to partially surround the enveloping area, or not to surround a part of the enveloping area. In this way, by the grounding portion 19a and the grounding portion 19b surrounding the first region, the second region, and the third region, noise immunity can be improved.

Figure 10:
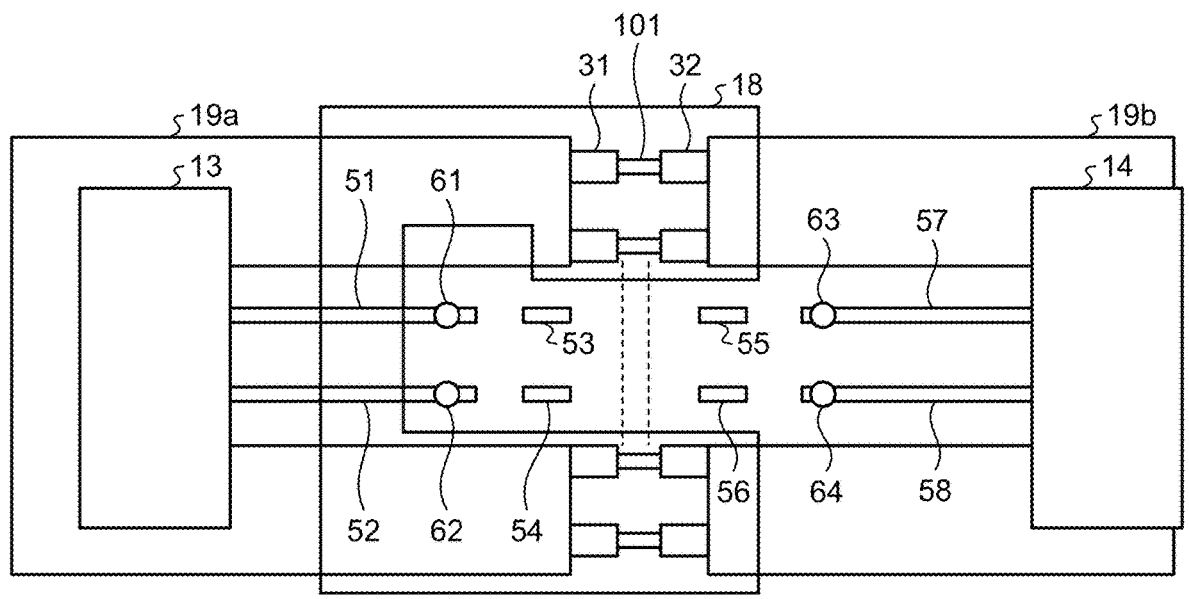
FIG. 10 is a view of the common substrate having the interface circuit illustrated in FIG. 5 mounted thereon, as viewed from the substrate mounting surface side.
Figure 11:
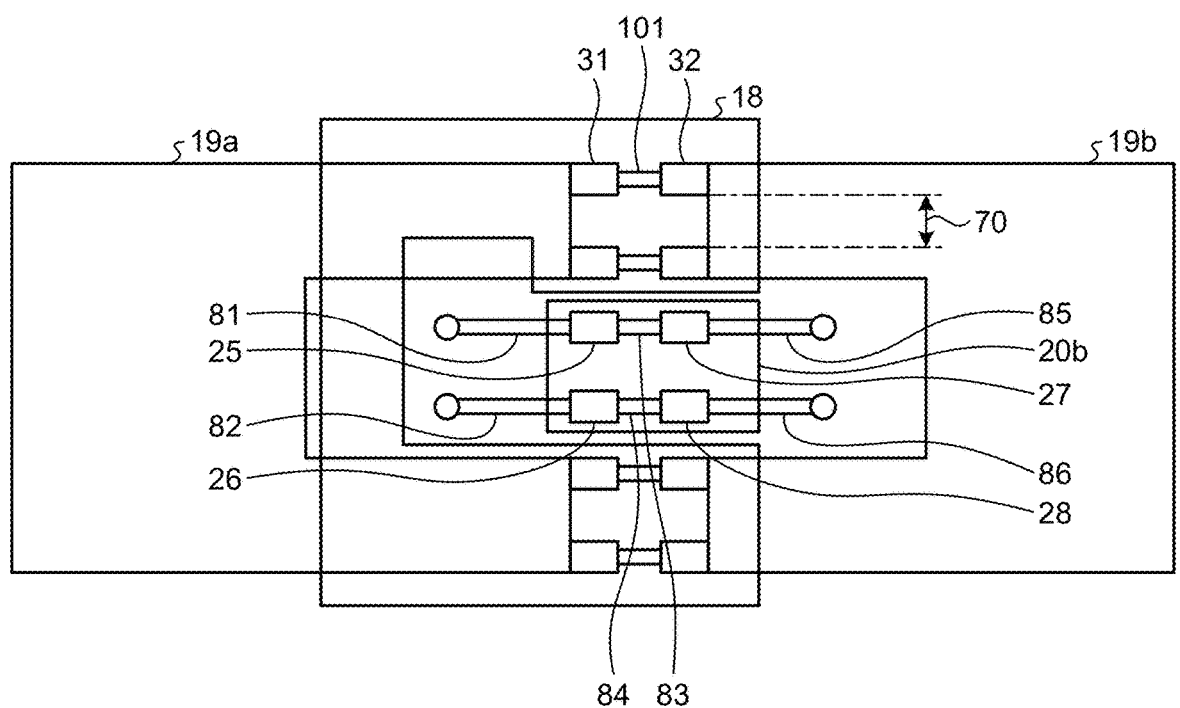
FIG. 11 is a view of the common substrate having the interface circuit illustrated in FIG. 5 mounted thereon, as viewed from the back surface side.

Next, description is given for a mounding example implementation of the interface circuit in a case where the power supply circuit is an isolated power supply circuit. FIG. 10 is a view of the common substrate 5a having the interface circuit 7a illustrated in FIG. 5 mounted thereon, as viewed from the substrate mounting surface side. FIG. 11 is a view of the common substrate 5a having the interface circuit 7a illustrated in FIG. 5 mounted thereon, as viewed from the back surface side of the substrate 5a. The said "substrate mounting surface" refers to a surface of the common substrate 5a on which elements such as the communication circuit 13 and the connector 14 are mounted, which is also referred to as front surface or first surface. The said "back surface" refers to a rear surface when the substrate mounting surface of the common substrate 5a is regarded as a front surface, which is also referred to as second surface.

The mounting example illustrated in FIGS. 10 and 11 is equivalent to a configuration obtained by removal of the isolation device 15 and the first wiring line connection unit 20a from the mounting example illustrated in FIGS. 8 and 9 to adapt to the case where the power supply circuit is an isolated power supply circuit.

Figure 12:
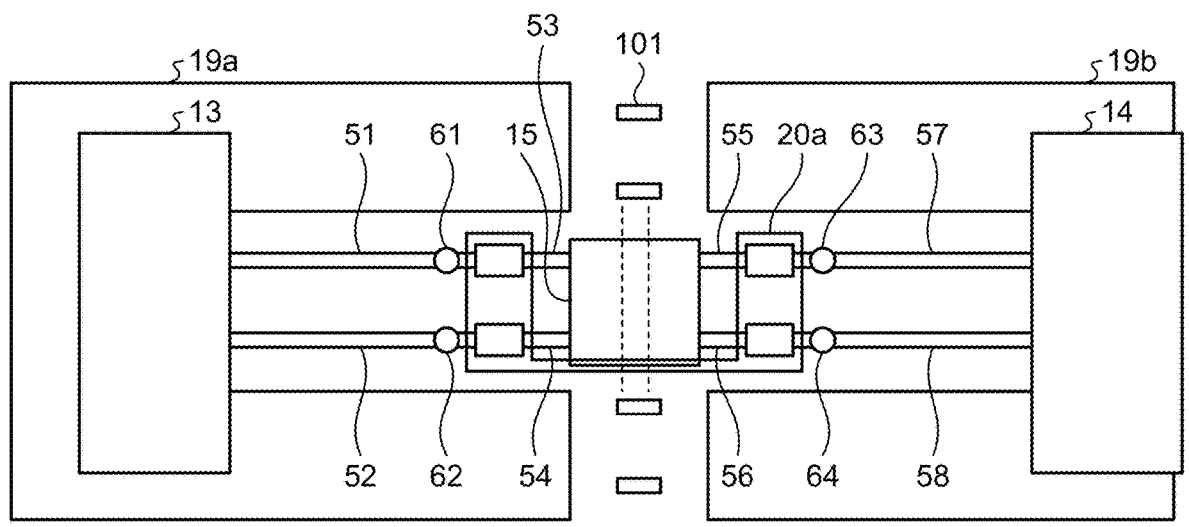
FIG. 12 is a view of the common substrate having the interface circuit illustrated in FIG. 7 mounted thereon, as viewed from the substrate mounting surface side.
Figure 13:
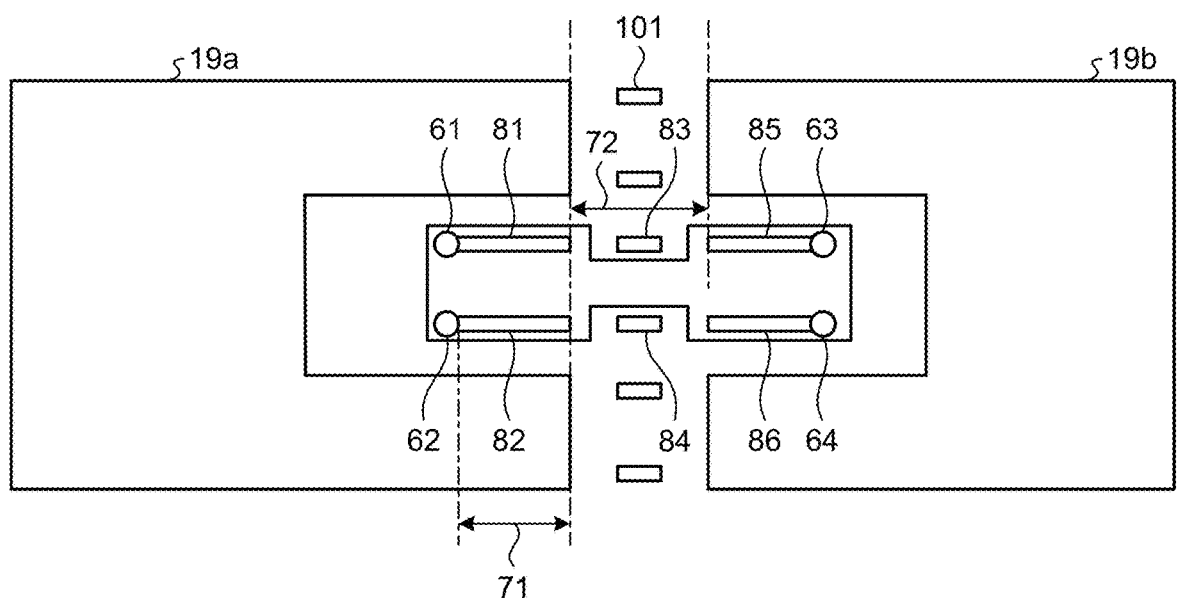
FIG. 13 is a view of the common substrate having the interface circuit illustrated in FIG. 7 mounted thereon, as viewed from the back surface side.

Next, description is given for a mounting example of the interface circuit in a case where the power supply circuit is a non-isolated power supply circuit. FIG. 12 is a view of the common substrate 5b having the interface circuit 7b illustrated in FIG. 7 mounted thereon, as viewed from the substrate mounting surface side. FIG. 13 is a view of the common substrate 5b having the interface circuit 7b illustrated in FIG. 7 mounted thereon, as viewed from the back surface side of the substrate 5b. The said "substrate mounting surface" refers to a surface of the common substrate 5b on which elements such as the communication circuit 13 and the connector 14 are mounted, which is also referred to as front surface or first surface. The said "back surface" refers to a rear surface when the substrate mounting surface of the common substrate 5b is regarded as a front surface, which is also referred to as second surface.

The mounting example illustrated in FIGS. 12 and 13 is equivalent to a configuration obtained by removal of the second wiring line connection unit 20b and the ground connection unit 18 from the mounting example illustrated in FIGS. 8 and 9 to adapt to the case where the power supply circuit is a non-isolated power supply circuit.

In the mounting examples illustrated in FIGS. 8 to 13, the first wiring lines, the first region, and the second region are placed on the first surface of the common substrate on which the interface circuit is mounted, the second wiring lines and the third region are placed on the second surface of the substrate, and the first wiring lines and the second wiring lines are connected to each other through the vias. By using the mounting examples implementations illustrated in FIGS. 8 to 13, both of a region for mounting the first wiring line connection unit 20a and another region for mounting the second wiring line connection unit 20b are not located on one and the same surface, thereby making it possible to prevent the mounting surface of the substrate from upsizing.

A specific example of operation and mounting of the present embodiment will next be described. First, the industrial device 1a including the power supply circuit 10 and the interface circuit 7a having been subjected to mounting as illustrated in FIGS. 10 and 11 will be described by way of example. The PC 2 and the industrial device 1 are connected to each other under a condition in which the control unit 3 is connected to the industrial device 1a, and the wiring line connecting the positive terminal of the connection connector 30 and the control unit 3 to each other is grounded at the ground point 16. Under this condition, the controller 6 transmits a signal to and receives a signal from the PC 2 through the communication circuit 13 and the connector 14. A communication signal that is a signal transmitted and received between the controller 6 and the PC 2 is communicated through the vias 61 to 64.

Since the interface circuit 7a has the ground connection unit 18 mounted thereon, the grounding portion 19a and the grounding portion 19b are connected to each other. In this condition, a spacing 70 illustrated in FIG. 11 between the connection parts constituting the ground connection unit 18 is determined depending on the data transmission rate of the interface circuit 7a. The spacing 70 is a distance between two connection parts 31 in a direction perpendicular to the transmission direction of a signal transmitted by the interface circuit 7a. The spacing 70 is determined depending on the transmission rate of a signal transmitted by the interface circuit 7a. This can provide communication having reduced noise. The spacing 70 is determined to be, for example, ⅛ or less of a wavelength λ that corresponds to the frequency of a signal transmitted by the interface circuit 7a.

Next, the industrial device 1b including the power supply circuit 10a and the interface circuit 7b experiencing the mounting as illustrated in FIGS. 12 and 13 will be described by way of example. In this case, communication signals that are signals transmitted and received between the controller 6 and the PC 2 are communicated without passing through the vias 61 to 64. Specifically, a communication signal is communicated between the connector 14 and the communication circuit 13 through the wiring lines, the connection parts constituting the first wiring line connection unit 20a, and the isolation device 15. In addition, since the interface circuit 7b does not include the ground connection unit 18, the grounding portion 19a and the grounding portion 19b are not connected to each other. Therefore, the wiring lines 81 to 86 on the second surface connected to the first wiring line connection unit 20a through the vias 61 to 64 and the vias 61 to 64 become acting as a stub, thereby resulting in degradation of the communication signal. Therefore, the stub length that is the length of a wiring line that acts as a stub is desirably determined not to prevent the communication signal from degrading depending on the transmission rate of the signal transmitted by the interface circuit 7b. The stub length is the sum of the length of each of the wiring lines 81 to 86 and the length of each of the vias 61 to 64. That is, the stub length is a length of a portion of the second wiring line in a transmission direction of the signal transmitted by the interface circuit 7b. In FIG. 13, the stub length is the sum of the length 71 of the wiring line 81 and the length of the via 61.

In addition, since the interface circuit 7b does not include the second wiring line connection unit 20b, a gap 72 occurs between the wiring lines 81 and 82 and the wiring lines 85 and 86 on the second surface, i.e., between stubs. This gap 72 may possibly cause noise. Therefore, the length of the gap 72 is desirably determined to allow noise to be reduced so as to prevent malfunction or stoppage of the communication circuit 13 and the controller 6. The gap 72 is a gap between the wiring lines directly connected to the communication circuit 13 and the wiring lines directly connected to the connector 14, of the wiring lines 81 to 86 that are the second wiring lines. The gap 72 is determined to be, for example, 1/8 or less of the wavelength λ, that corresponds to the frequency of a signal transmitted by the interface circuit 7b. That is, the gap 72 is a distance between a stub on the communication circuit 13 side and a stub on the connector 14 side. For example, assuming 1-kV pulse-shape noise with 1 μs in width, if application of noise does not cause a voltage of 0.01 V or higher across the gap, the length of the gap 72 is calculated as 1.57 mm or longer. The specific value of the length of the gap may be determined according to an expected noise level and a requirement on noise, and is not limited to the value of this example.

Note that the mounting methods or manners illustrated in FIGS. 8 to 13 are merely by way of examples, and the implementation manners of the interface circuit of the present embodiment is not necessarily limited by the examples described above.

The present embodiment curbs deterioration of a communication signal caused by communalizing substrates, by means of definition of the stub length, definition of the gap, and the like, which are described above. Meanwhile, additionally or alternatively, at least one of a delay compensation circuit that compensates for a delay of a signal transmitted by the interface circuit, and a noise reduction circuit that reduces noise in a signal transmitted by the interface circuit may be provided in the communication circuit 13 in order to curb degradation of the communication signal. In addition, at least one of the delay compensation circuit and the noise reduction circuit may be provided between the communication circuit 13 and the connector 14. FIG. 14 is a diagram illustrating an example configuration of an industrial device having a compensation circuit 200 between the communication circuit 13 and the controller 6. An industrial device 1c illustrated in FIG. 14 includes the compensation circuit 200 that is a delay compensation circuit or a noise reduction circuit, between the communication circuit 13 and the controller 6. In addition, the isolation device 15 is not limited to a transformer, but any device can be used as long as it is a circuit or an element capable of providing electric isolation.

Moreover, at least one of a protection circuit, a filter circuit, and a noise filter circuit may be provided between the communication circuit 13 and the connector 14. Alternatively, at least one of a pull-up resistor for stabilizing a logic of a communication signal, another pull-up resistor, and a damping resistor for shaping a signal may be provided between the communication circuit 13 and the connector 14.

In addition, the use of the interface circuit of the present embodiment may cause differences in the quality of a communication signal, the delay of a response time, and the like, depending on whether the isolation device 15 is mounted or not, that is, depending on how is the actual configuration of the interface circuit. Accordingly, these differences may be corrected by signal processing on them using the communication circuit 13 or the controller 6. Alternatively, a signal processing circuit may be provided to correct them.

Moreover, in the present embodiment, changeover of the configuration of the interface circuit is performed based on whether or not to mount a connection part such as 0-Ω resistor, but such a changeover method or manner is not limited to this example. Such changeover may be realized using, as a connection part, a switch such as an analog switch capable of performing switching between a closed state and an open state depending on an electrical signal.

In this case, changeover of the configuration of the interface circuit may be realized by the controller 6 or the communication circuit 13 recognizing the type of the power supply circuit using identification information or the like, and generating an electrical signal for controlling closing and opening for the switch depending on whether the power supply circuit is of an isolation type or not.

As described above, in the present embodiment, the common substrate 5 has mounted thereon a wiring line for mounting the isolation device in the interface circuit, regardless of whether or not to mount the isolation device. This can eliminate difference in wiring pattern dependent on the type of the power supply circuit in the electronic device to be mounted, thereby making it possible to communalize the substrates on each of which an interface circuit is mounted. In addition, correction of the quality of the communication signal, the delay of the response time therein, and/or the like can improve the quality of the communication signal, the delay of the response time therein, and/or the like which may depend on the difference in configuration.

The configurations described in the foregoing embodiment are merely examples of contents of the present invention, each of which can be combined with other publicly known techniques, and partially omitted and/or modified without departing from the scope of the present invention.

REFERENCE SIGNS LIST

1 industrial device; 2 PC; 3 control unit; 4 power supply substrate; 5, 5a, 5b common substrate; 6 controller; 7, 7a, 7b interface circuit; 8 external power supply; 9 power supply connector; 10, 10a power supply circuit; 11 isolation transformer; 12 inter-substrate connector; 13 communication circuit; 14 connector; 15 isolation device; 16 ground point; 17 wiring line connection unit; 18 ground connection unit; 19a, 19b grounding portion; 20a first wiring line connection unit; 20b second wiring connection unit; 21-28, 31, 32 connection part; 30 connection connector; 51-58, 81-86, 101 wiring line; 61-64 via; 90 first region; 91 second region; 92 third region; 93 fourth region.

The invention claimed is:

1. An interface circuit mountable on an electronic device and connectable to another electronic device, the interface circuit comprising:
a connector connectable to the other electronic device;
an electronic circuit capable of generating a transmission signal to the other electronic device;
a first region that is defined between the electronic circuit and the connector to allow an isolation device to be mounted therein;
a first wiring line to connect the electronic circuit and the connector to each other through the first region; and
a second wiring line to connect the electronic circuit and the connector to each other without passing through the first region.

2. The interface circuit according to claim 1, further comprising:
a second region that is defined between the electronic circuit and the connector to allow a first connection part to be mounted therein; and
a third region that is defined between the electronic circuit and the connector to allow a second connection part to be mounted therein, wherein
the first wiring line connects the electronic circuit and the connector to each other through the first region and the second region, and
the second wiring line connects the electronic circuit and the connector to each other through the third region.

3. The interface circuit according to claim 2, further comprising:
a first grounding portion connected to the electronic circuit;
a second grounding portion connected to the connector;
a fourth region that is defined between the first grounding portion and the second grounding portion to allow a third connection part to be mounted therein; and
a third wiring line to connect the first grounding portion and the second grounding portion to each other through the fourth region.

4. The interface circuit according to claim 3, wherein the first grounding portion and the second grounding portion are shaped to surround the first region, the second region, and the third region.

5. The interface circuit according to claim 3, wherein two of the third connection parts to be connected to an end portion of the second grounding portion can be mounted in the fourth region, and a spacing between the two of the third connection parts in a direction perpendicular to a transmission direction of a signal transmitted by the interface circuit is determined according to a transmission rate of a signal transmitted by the interface circuit.

6. The interface circuit according to claim 3, wherein:
the second connection part is mounted in the third region,
the third connection part is mounted in the fourth region, and
the electronic circuit and the connector are connected to each other through the second wiring line and through the second connection part, and the first grounding portion and the second grounding portion are connected to each other through the third connection part and the third wiring line.

7. The interface circuit according to claim 2, wherein:
the isolation device is mounted in the first region,
the first connection part is mounted in the second region, and
the electronic circuit and the connector are connected to each other through the first wiring line, the isolation device, and the first connection part.

8. The interface circuit according to claim 2, wherein:
the interface circuit is mounted on a substrate,
the first wiring line, the first region, and the second region are mounted on a first surface of the substrate, and the second wiring line and the third region are mounted on a second surface of the substrate, and the first wiring line and the second wiring line are connected to each other through a via formed in the substrate.

9. The interface circuit according to claim 2, wherein a length of a portion of the second wiring line in a transmission direction of a signal transmitted by the interface circuit is determined according to a transmission rate of a signal transmitted by the interface circuit.

10. The interface circuit according to claim 2, wherein:
the first connection part and the second connection part are each a switch capable of switching between a closed state and an open state depending on an electrical signal, and
the first connection part is mounted on the second region, and the second connection part is mounted on the third region.

11. The interface circuit according to claim 10, wherein the electrical signal is generated by the electronic circuit.

12. The interface circuit according to claim 1, further comprising:
a delay compensation circuit to compensate for a delay of a signal transmitted by the interface circuit.

13. The interface circuit according to claim 1, further comprising:
a noise reduction circuit to reduce noise in a signal transmitted by the interface circuit.

14. A substrate on which the interface circuit according to claim 1 is mounted.

15. An electronic device including the substrate according to claim 14.

16. A programmable controller including the substrate according to claim 14.

17. A substrate to be mounted in an electronic device, on which an interface circuit is mounted, the interface circuit including: a connector connectable to another electronic device; an electronic circuit capable of generating a transmission signal to the other electronic device; a first region that is defined between the electronic circuit and the connector to allow an isolation device to be mounted therein; a first wiring line to connect the electronic circuit and the connector to each other through the first region; a second wiring line to connect the electronic circuit and the connector to each other without passing through the first region, and a delay compensation circuit to compensate for a delay of a signal transmitted by the interface circuit, the substrate comprising:
a controller connected to the interface circuit, wherein
the controller generates an electrical signal for controlling on whether a connection part of the interface circuit should be connected or opened according to a type of a power supply circuit included in the electronic device.

* * * * *